United States Patent [19]

Dingwall

[11] Patent Number: 4,833,473
[45] Date of Patent: May 23, 1989

[54] DIGITAL TO ANALOG CONVERTER WITH SWITCH FUNCTION COMPENSATION

[75] Inventor: Andrew G. F. Dingwall, Princeton Township, Mercer County, N.J.

[73] Assignee: Harris Semiconductor Patents, Inc., Melbourne, Fla.

[21] Appl. No.: 104,406

[22] Filed: Oct. 5, 1987

[51] Int. Cl.⁴ ............................................. H03M 1/78
[52] U.S. Cl. ..................................... 341/154; 333/124
[58] Field of Search ................ 333/124; 340/347 DA, 340/347 DD; 341/153, 154

[56] References Cited

U.S. PATENT DOCUMENTS

4,250,492  2/1981  Yamakido et al. ........... 340/347 DA

Primary Examiner—William M. Shoop, Jr.
Assistant Examiner—Marc S. Hoff
Attorney, Agent, or Firm—Henry Schanzer; W. Joseph Shanley

[57] ABSTRACT

A digital to analog converter including an R-2R ladder network receives digitally encoded sample signals in parallel through a set of chains of transistor switches, each chain having equal delay. The ladder network output impedance matches the characteristic impedance of a coaxial cable transmission line that couples the converter output to a utilization circuit. Output resistances of the switches which are connected to ladder network rung circuits are scaled in accordance with a predetermined algorithm to maintain symmetry of parallel connected resistive branches of the latter network seen at each rail terminal of the ladder. Three of the most significant bits of each input binary coded work are decoded to a bar code format before being coupled through the set of switch chains. Switch output conductances in the switch chains are scaled in accordance with a stage-to-stage conductance ratio F, and at selected stages of selected ones of the chains dummy-load switches are added to enable both conformance to that ratio and substantial equality of delay among all of the chains.

19 Claims, 4 Drawing Sheets

DIGITAL TO ANALOG CONVERTER WITH SWITCH FUNCTION COMPENSATION

CROSS-REFERENCE TO RELATED APPLICATIONS

A copending application of A. G. F. Dingwall, Ser. No. 07/104,405, and now U.S. Pat. No. 4,783,643, filed on even date herewith, entitled "Impedance Transforming Circuit For Multibit Parallel Digital Signal Circuits," is related to this application and has a common assignee.

FIELD OF THE INVENTION

This invention relates to analog signal converter circuits, and it relates more particularly to circuits with improved linearity as compared to prior art circuits for converting parallel digital signal streams comprising a succession of digital signal word, or sample, values.

BACKGROUND OF THE INVENTION

Digital to analog signal converters usually employ a source of bit-parallel digital signal values to control the states of a set of switches which in turn control the application of a reference supply current or voltage to respective bit inputs of a resistance ladder network. The reference supply and network interact to combine the different bit signals of each digital sample with appropriate weighting to yield an analog signal sample with amplitude corresponding to the value of the digital signal sample.

A converter using a weighted resistor network and providing an output through an operational amplifier is shown in an article entitled "Digital-to-analog converter" by D. H. Sheingold, at pages 257–259 of *MCGRAW-HILL ENCYCLOPEDIA OF SCIENCE & TECHNOLOGY*, Fifth Edition, Vol. 4, 1982. The output appears as a voltage developed across a feedback resistor of the amplifier.

Another converter, employing the well-known R-2R resistor ladder network, is shown in an article entitled "31.6 Digital to analog converters (DAC)" at pages 31/10–31/11 in *ELECTRONICS ENGINEER'S REFERENCE BOOK*, Fifth Edition, 1983, Edited by F. F. Mazda. That converter provides current source connected transistors between digital-signal-controlled switches and the respective, ladder rung inputs. A reference current amplifier provides the necessary current, and the converter output is a current proportional to the digital sample value. Problems with linearity and, in the reference amplifier, settling time as well as the balance between stability and speed are noted in the article. Current sources are well-known to have compliance problems at the relatively high currents necessary for converter operations.

One problem often encountered is the need for amplification of a converter output before utilization. In high frequency systems, e.g. sample rates in the tens of megahertz range, of sufficient bandwidth and linearity for transmitting signals for, e.g., video display purposes, an amplifier generally is complex and therefore typically relatively expensive. If the converter is to drive the utilization circuit directly, a transmission line such as coaxial cable is usually required because it is not often convenient to locate the converter and utilization circuit immediately adjacent to one another. However, converter ladder networks typically have output resistances of the order of thousands of ohms and there are impedance matching difficulties in matching such high resistances to the characteristic impedance of transmission lines. One reason for the high output impedance level of the ladder network is to make its linearity of conversion over the full dynamic range independent of switch, or other transistor, effective resistances in circuits driving the ladder rungs.

SUMMARY OF INVENTION

Relaxation of the constraints under which prior analog to digital converters operated is achieved by employing in such a converter a resistance ladder network of such low output impedance that it can be coupled directly to a transmission line for providing analog signals to a utilization circuit.

One embodiment in accordance with the present invention employs an R-2R ladder network, the real parts of the output impedances of switches driving the ladder rung inputs are scaled so that the total series resistance of each switch output resistance and the ladder rung resistor to which it is connected is substantially the same as the effective resistance presented at the rail connection point of such rung resistor from network portions of less value significance in the ladder.

For applications in which the scaled switch output resistances may cause troublesome differences in switch actuation time within any sample operation time, each switch is made a part of a chain of tandem connected, impedance matching switches of approximately the same delay. The degree of similarity of delay required is a function of the type of application, and various features of the chains of switches contribute different degrees of improvement. Examples of such features include equal numbers of switches in the through signal transmission path of each chain, scaling of switch output conductances by a uniform ratio along each chain of the full set of chains, and providing dummy load switches at one or more selected stages of a chain. Bar coding of two or more of the most significant binary coded bits of digital input to the converter also improves converter operation with respect to the switches.

BRIEF DESCRIPTION OF THE DRAWINGS

A more complete understanding of the invention can be obtained from a consideration of the following Detailed Description taken in connection with the appended claims and the attached Drawings in which:

FIG's. 3 and 4 show signal state diagrams illustrating the operation of the binary-to-bar decoder of FIG. 2.

FIG's. 5 and 6 show top and end views, respectively, of CMOS transistor, inverting, switch illustratively employed for implementing the present invention.

DETAILED DESCRIPTION

Figure 1:
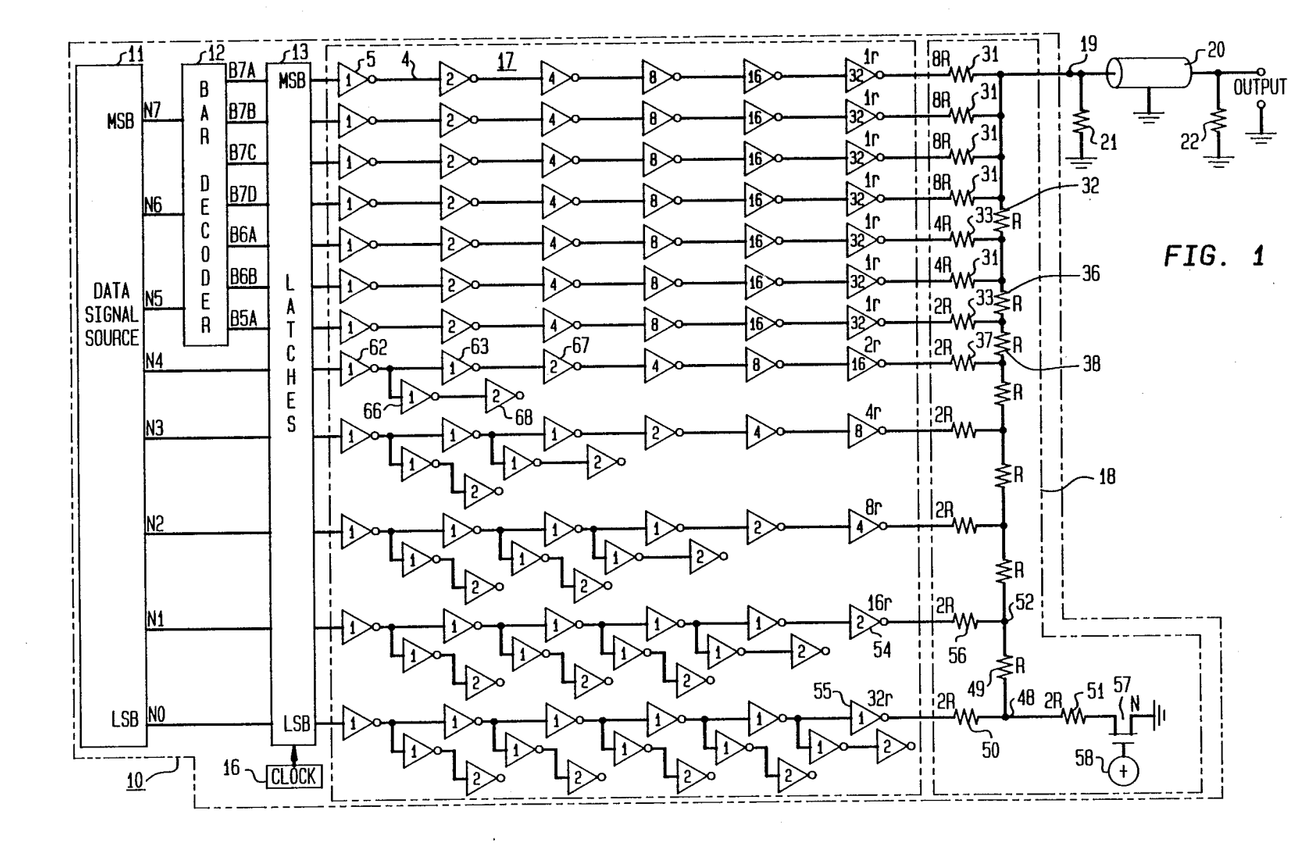
FIG. 1 shows a digital to analog converter circuit in accordance with the invention.

Referring now to FIG. 1, there is shown a digital to analog converter (DAC) 10 in accordance with the present invention. Individual major blocks of the DAC 10 will be described briefly to show their interrelationship in the DAC environment, and thereafter those blocks will be discussed individually in greater detail to demonstrate certain features and advantages of the invention.

DAC 10 includes a data signal source 11 of any convenient type providing ground reference, multibit, digital signals in bit-parallel, binary code, word format. Illustratively, 8-bit words, herein sometimes called "samples" or "sample values," are employed and include the parallel signals N0 through N7 in increasing order of binary significance. A binary-to-bar decoder 12, hereinafter simply a bar decoder, is also ground referenced and couples two or more, illustratively three, of the most significant bits (MSB) in the output of source 11 to a set 13 of latches. The nature and purpose of decoder 12 will be further discussed subsequently. Latch set 13 includes one ground referenced, latch circuit, such as the well known D-type flip-flop circuit, for each of the seven parallel output bits of decoder 12 and for each of the five least significant bits (LSB) of the input signal from source 11. Periodic signals from a clock signal source 16 are applied to the inputs of the latch circuits to cause them to sample simultaneously their respective inputs from source 11 or decoder 12. Each of the latch circuits has essentially the same output impedance, and that is typically 500 ohms or more.

Latch circuits of the set 13 function as input connection circuits for a set 17 of transistor switch chains employed for impedance transformation. Outputs of the latches are coupled through respective chains of the set 17 to an output connection circuit, illustratively the respective rung input connections of an R-2R resistance ladder network 18. Each chain, such as the chain 4, includes plural transistor switches, illustratively inverting switches such as a switch 5 in FIG. 1, connected in tandem to form a transmission path for asynchronous propagation of signals of one bit position from the latch set 133 to network 18. As will be shown, it is presently preferred to employ for the respective switches complementary metal oxide semiconductor (CMOS) inverting switches. However, one or more of the switches in a chain can be implemented in other forms of logic switches such as NAND, NOR, or transmission gates.

The network 18 converts the received bit-parallel digital signal words to corresponding successive analog signal samples or values, which appear at an output terminal 19 of the digital to analog converter. Although network 18 is basically of the well-known R-2R configuration, it includes modifications, to be described, to accommodate both improved converter linearity and the bar decoder 12 function.

Signals at terminal 19 are coupled through a transmission line such as a doubly terminated coaxial cable 20 to an output, or utilization, circuit (not shown). Typical utilization circuits requiring the speed and precision of a wide-bit, low-output-impedance DAC driving through a coaxial cable include robotic-type applications for machine control and couplings of telemetering precision data from remote locations. Terminating resistors 21 and 22 connect the input and output ends, respectively, of cable 20 center conductor to ground and have resistance values of, e.g., 75 ohms for cable of that characteristic impedance.

Returning to a consideration of the bar decoder 12, it is provided to reduce certain analog output signal distortion effects arising from the employment of transistor switches in the switch chain set 17 and to reduce the amount of semiconductor area required to implement the switch chains as compared to impedance transformation for fully binary coded signals. The mentioned distortion reduction results from a reduction in the number of switches in the final stage of chain set 17 that must change state under worst-case conditions, i.e. at the binary code representation transmission across the midrange level of the DAC. The inverting, CMOS transistor switches illustratively employed are known to be subject to certain nonsymmetrical switching characteristics, to be subsequently further discussed. Those nonsymmetrical characteristics can cause undesirable, signal level transmission time, amplitude excursions in converter analog output. Oftentimes the DAC must operate with respect to digital signals with such high word rates that effects of those excursions consume a significant part of each sample time before dissipation and thus cause undesirable distortion in the analog output. A word rate in the tens of megahertz range, e.g. forty million words per second, is such a high word rate when using CMOS switches characteristic of the present state of the art.

Figure 3:
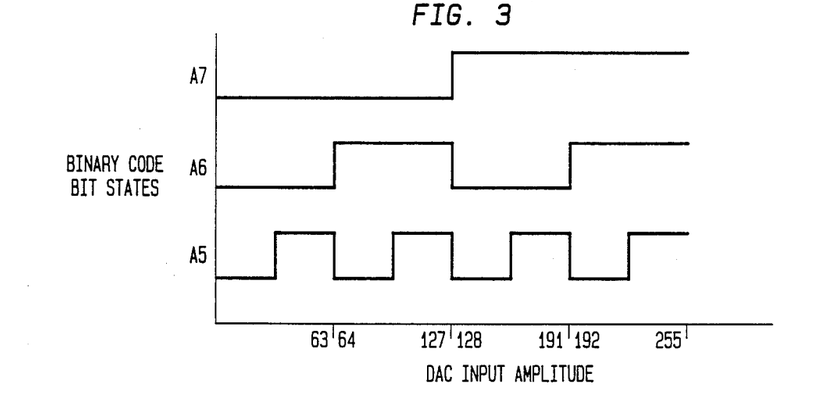

The impact of the transmission time excursion effects just mentioned is advantageously reduced by decoding at least some, illustratively three, of the most significant bits of signals from source 11 to a so-called "bar" format to minimize the numbers of bits which change state at any given time when input information is sequencing through its range of possible values. The major changes in current supplied to output terminal 19 occur at the three, binary coded, most significant bit positions. For any given step change in analog signal at terminal 19, the contributing final stage switches of chain set 17, in the bar coded positions corresponding to those three binary coded bit positions, are all sources or all sinks, rather than being a combination of sources and sinks as would have been the case in the absence of bar coding, i.e. with binary coding. This is evident from the diagram of FIG. 4 which shows that any increase in DAC input amplitude which involves bar coded bits requires one or more bits to go high, i.e. sourcing current. Similarly, a decrease in input amplitude requires one or more bits to go low, i.e. sinking current. By contrast, in the binary coded version of those same three bits, all three change state at the same time for an increase passing through the midrange point of the sequence; and they provide to output terminal 19 the difference between one source current and two sink currents as shown in FIG. 3. The bar code resembles a cycle of the output of the well known twisted ring counters, or Johnson counters or Moebius counters. All are characterized by a sequential pattern of signal states in which, starting from a least significant all-ZERO pattern, an all-ONE pattern of growing size appears to move form the LSB position toward the MSB position.

Figure 2:
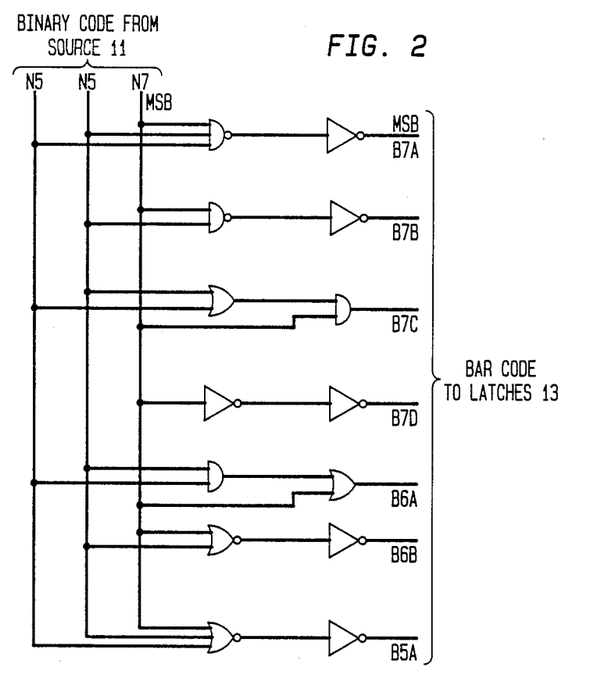
FIG. 2 shows a logic diagram of a binary-to-bar decoder circuit useful in the converter of FIG. 1.

FIG. 2 depicts a schematic diagram of one form of logic circuit for implementing the decoder 12 to decode the binary coded bits N5, N6, and N7 into the seven corresponding bar coded bits B5A, B6B, B6A, B7D, B7B, B7A (in ascending order of significance). The two stages of logic are utilized for each bar coded bit to assure essentially equal signal propagation delay among all bit circuit paths of the decoder. Triple-digit reference characters are employed for the bar coded bits to facilitate association of the bar coded bits with respective treatments of their corresponding, binary level, rung circuits in ladder network 18.

Boolean-type expressions for each bar coded bit derivation, in ascending order of bar coding significance and which also describe the logic circuit of FIG. 2 are:

B5A = A7 + A6 + A5

B6B = A7 + A6

B6A = A7 + (A6 + A5)

B7D = A7

B7C = A7·(A6 + A5)

B7A = A7·A6·A5.

Figure 4:
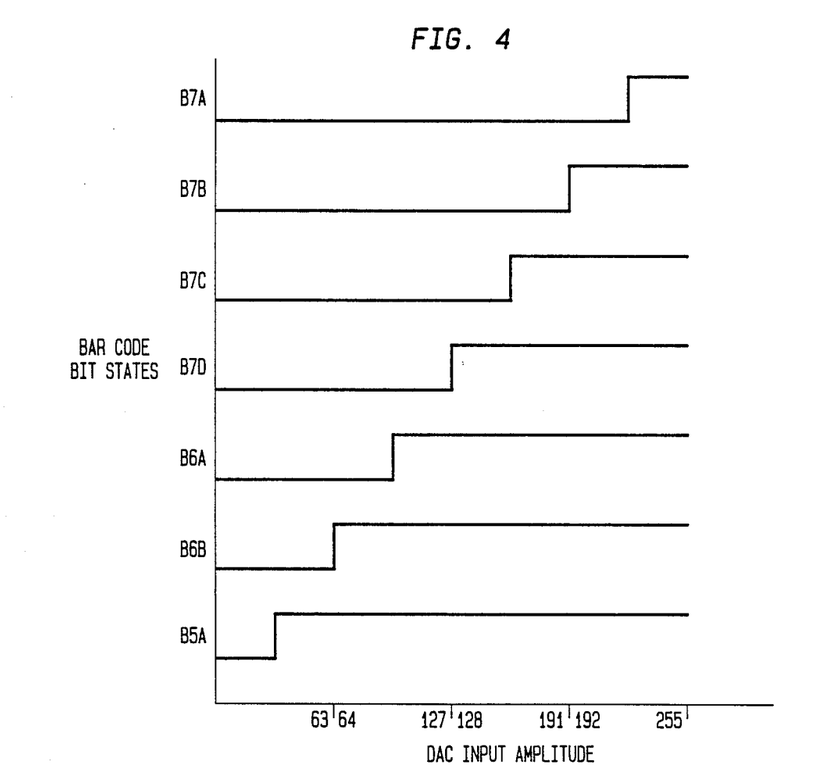

FIGS. 3 and 4 are signal state diagrams illustrating the binary coded bit state inputs to decoder 12 and the bar coded bit state outputs from the decoder, respectively, each with respect to DAC input amplitude sample values. It can be seen in FIG. 4 that, in the bar code pattern for any sample value, any ONE bits are all together and any ZERO bits are all together. No more than one transition between ONE and ZERO bit states is found in any given sample value representation, and there is only one bit state transition involved in changing from one value to an adjacent value in the sequence of values that can be represented. Note in particular, that at the worst case (for binary), midrange transition between values of 127 and 128 for the illustrative 8-bit example, the only bar coded bit that changes state is the bit B7D. Of course, if the input sample value could change between two successive sample times from 31 (all ZEROs) to 255 (all ONEs), seven bar coded bits would change state in the one operation while only three binary coded bits would change state in the one operation. However, in systems requiring multibit, signal, impedance transformations of the type here described, bandwidth limitations usually prevent large excursions from occurring which would involve a single-step analog sample level change that would involve more than one sequential level step in the bar code sequence for the more significant three binary coded bits of the digital input.

As previously mentioned, the set 13 of latches includes twelve clocked D flip-flop circuits (not separately shown). Each such flip-flop has a data input connection, a clock input connection for activating the flip-flop to sample the signal at its data input, and true and complement output connections, only the true output connections being utilized in the set 13. Each of those flip-flop circuits presents an output impedance having a real, or conductance, part which is typically on the order of 500 ohms. However, a low resistance ladder network, that does not require an amplifier to drive a doubly terminated coaxial cable, must exhibit a much small output impedance in order to drive the cable without significant reflection problems resulting from the impedance mismatch. That low resistance network must in turn be driven from correspondingly low output impedance sources for its individual rungs, i.e. impedances which will not destroy the essential DAC linearity of monotonic operation. Consequently, the set 17 of CMOS switch chains is provided to develop the necessary current level for driving respective rungs of the low resistance ladder with substantially equal signal propagation delays through the respective chains. The equality of propagation delays is essential in order that all final stage switches will operate at essentially the same times.

Before discussing the switch chains further, it is useful at this point to discuss the resistance ladder network 18 in somewhat greater depth. Network 18 is basically a conventional R-2R ladder network with certain modifications to accommodate employment of the bar coder 12. In such a network ladder rail resistors of relative resistance R are connected in series between the network analog output terminal 19 and ground, one such rail resistor is included in the series connection between rung resistor connection points thereto for each adjacent pair of input binary coded word bit signals to the DAC. In addition, and as usual for R-2R ladder networks, a resistor of 2R value is included between the least significant rail resistor R and ground.

Each ladder rung relative resistance 2R is realized as one or more resistors connected to a common circuit point in the rail series connection. Each binary coded digital input is applied through a ladder rung resistance of relative resistance 2R connected to a rail resistor terminal that is the more remote electrically from ground of the two rail resistor terminals. In an application wherein each of the terminating resistors 21 and 22 of cable 20 is 75 ohms (corresponding to a static load of 37.5 ohms with 75 ohm termination at both ends of cable 20), ladder rail resistance R is about 150 ohms, rung resistance 2R is 300 ohms, and a reference voltage supply is five volts, the ladder network presents a full-scale voltage of 1 volt to the doubly terminated 75 ohm cable 20.

It can be seen in FIG. 1 that the seven bar coded bits are adapted into the ladder weighting scheme by employing plural parallel circuit resistors to make up the effective 2R rung relative resistance in certain cases. Those resistors are considered to be in parallel circuits in an equivalent circuit sense because each is at all times connected through one or the other of its driving switch transistors and reference supply connections to ground return. Thus, the four most significant bar coded bits B7A through B7D appearing at the output of chain set 17 are coupled through four rail resistors 31, each of resistance 8R, which are all connected to the rail resistor series circuit combination at the same electrical point, i.e. adjacent to output terminal 19 and at the top (as illustrated) of rail resistor 32. Similarly, the bar coded bit group B6A and B6B appearing in the output of chain set 17 are connected through two rung resistors 33, each of resistance 4R, to the rail resistor series circuit combination at a common electrical point between rail resistors 32 and 36. Finally, the signal-bit bar coded bit group B5A appearing in the output of chain set 17 is connected through a normal rung resistor 37, of resistance 2R, to the rail resistor series circuit combination at a common electrical point between rail resistors 36 and 38. It can now be seen that the ladder network R-2R resistance relationship for the addition of the bar coding feature is unchanged from what it would have been had all eight of the input binary coded bits been applied without the intervening bar coding shown.

Manufacturing tolerance on individual resistors of a low resistance, R-2R, ladder network is not critical as long as the R-2R ratio between rung and rail resistances is precisely maintained. That ratio is usually relatively easy to maintain in integrated circuit manufacturing processes, but it is disturbed if the output impedances of switches connected for driving the ladder rungs include resistances that are significant in terms of the ladder rung relative resistance 2R=300 ohms value. MOS transistors used in the example have maximum conducting resistances of 5 to 20 ohms that are still significant compared to the aforementioned 300-ohm rung resistance when overall linearity of better than one part in 512 is needed for 8 bits. In the example where 2R=300 ohms, the maximum resistance, LSB switch 55 has a relative resistance 32r. That relative resistance 32r should be of the same order of magnitude as 2R=300. In the present example, switch resistance of up to 20 ohms can be used with no significant loss of accuracy.

Figure 5:
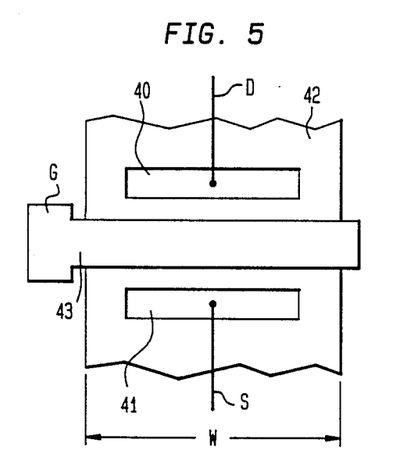
Figure 6:
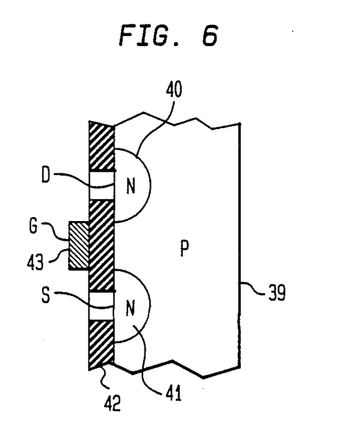

In FIG. 1, each rung resistor of ladder network 18 receives either a predetermined current level or a low impedance ground connection (zero current level), depending upon digital signal information state according to either the binary or bar code employed, in order to produce proper overall DAC operation. So there is a switch resistance in series with each rung circuit resistor at all times of DAC operation. That switch resistance, for the CMOS transistors illustratively employed, is a function of transistor device width W, i.e. gate terminal width. The wider the gate terminal overlying device semiconductor material, the smaller is the device conducting resistance r, and the larger is the device conductance G. FIGS. 5 and 6 illustrate that width dimension in relation to a typical MOS transistor, and FIG. 7 shows such transistors connected in inverting switches in a tandem connection.

FIGS. 5 and 6 are familiar top and end views, respectively, of metal oxide semiconductor transistor using P-type conductivity material for the body 39 of the transistor and having two adjacent N-type material diffusions 40 and 41, i.e. drain and source diffusions. A layer 42 of insulating material overlies the diffusion side of the device and has windows therethrough for drain and source leads to the respective diffusions. A gate metallization 43 on a portion of insulating material, not shown but comprising for example silicon dioxide material, surrounds the transistor body to define the device width W which determines device conducting resistance and the various device parasitic capacitances. Those resistances and capacitance values are utilized to advantage in configuring the chain set 17 to achieve impedance transformation with different output impedances but essentially equal signal propagation delays. An N-type transistor has the same appearance as shown in FIGS. 5 and 6 but the locations of P-type and N-type materials are interchanged.

Figure 7:
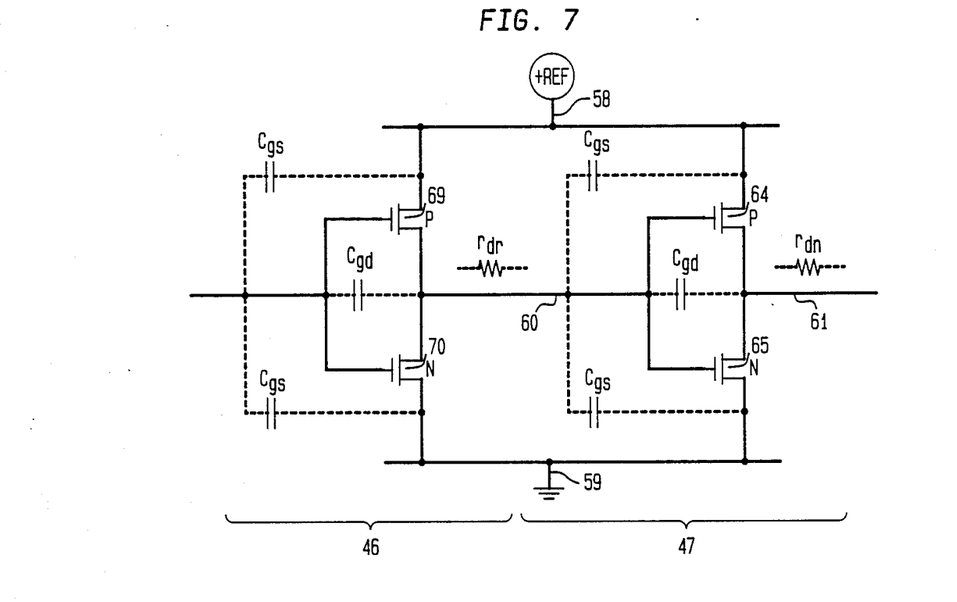
FIG. 7 shows a CMOS switch circuit pair as illustratively employed in the converting circuit of FIG. 1.

FIG. 7 illustrates an arbitrary pair of CMOS switches 46 and 47 of the type illustratively employed in chain set 17. The switch 46 includes a P-type transistor 69 and an N-type transistor 70 connected in series; the switch 47 includes a P-type transistor 64 and an N-type transistor 65 connected in series. Complementary bipolar transistors could be substituted for the CMOS transistors. The two switches are further connected by leads 58 and 59 between a positive reference voltage supply +REF and ground. That reference supply and ground are included in each switch schematic representation in the set 17 of FIG. 1. Parasitic gate-source and gate-drain capacitances $C_{gs}$ and $C_{gd}$, respectively, and the conducting resistance portions $r_{dr}$ and $r_{dn}$ of the output impedances of the illustrated driving switch 46 and driven switch 47, respectively, are schematically indicated with dashed lines in FIG. 7. As indicated with respect to switch 47, the signal input to each switch is provided by way of a lead 60 to the transistor gate terminals in parallel; and the output is provided by way of a lead 61 from the transistor drain terminals in parallel.

Input signals to a switch are presented with the high essentially open-circuit, input resistance of the switch transistor gate terminals and have either a high or a low binary signal state compared to the reference voltage. A high signal state turns on the N-type transistor and turns the P-type transistor off. Those conduction states place output lead 61 at ground if the switch is driving another switch of at a slightly positive voltage, corresponding to the voltage drop across the internal conducting resistance r of the conducting transistor, if the switch is driven a ladder rung resistor. A low input signal state turns the P-type transistor on and the n-type transistor off. Those conduction states place output lead 61 at the reference voltage level if the switch is driving another switch or at a slightly less positive voltage corresponding to the voltage drop across the resistance r of the conducting transistor if the switch is driving a ladder rung resistor.

It is noted here for further reference that it is well known that since PMOS and NMOS transistors are manufactured by somewhat different processes that their respective conducting resistances are often slightly different. The difference is uniform throughout a manufacturing batch, of devices and all transistors of any given chip in the batch, but it cannot be forecast for a given batch whether the PMOS or the NMOS transistors will have the larger conducting resistance. The total output resistance r of an MOS transistor also varies directly, and the conductance G inversely, with the transistor gate width W. Likewise the transistor capacitances Cgs and Cgd also vary directly with the transistor gate width W.

Turning now to a more detailed look at the ladder operation in relation to the switches driving respective rungs, the static effect of switch resistance on the R-2R ratio precision will be considered. For a linear ladder conversion function, and neglecting switch resistance for the moment, the resistance looking down the ladder from a rail terminal, such as terminal 48 in FIG. 1, toward the grounded end of the ladder is the effective resistance of a pair of rung sized resistances 2R, i.e. resistors 50 an 51, in parallel. The effective resistance can be expressed in the form $$R_{e48} = [(R_{50}) \times (R_{51})]/[(R_{50}+R_{51})],$$

which reduces to a rail resistance value $$R_{e48} = R$$

because the respective resistors 50 and 51 are equal. Backing up the ladder one step, a new effective resistance seen from a terminal 52 takes form $$R_{e52} = [(R_{56}) \times (R_{49}+R_{e48})]/(R_{56}+[R_{49}+R_{e48}]),$$

which reduces to a rail resistance value $$R_{e52} = R$$

because the sum of the old effective resistance $R_{e48}$ and the resistance of $R_{49}$ is equal to a rung resistance 2R and to the resistance of resistor 56. Similarly, effective resistances at other rail terminals, including output terminal 19, and ignoring switch output resistance, equal R.

The conducting resistance r, i.e. the real part of the switch output impedance, of the largest-width practical switch in the present state of the art is about 1 to 3 ohms. That value is clearly significant in relation to the aforementioned illustrative rung resistance 2R of 300 ohms. It has been found that the linearity of ladder function is adversely affected by such significant switch resistances which distort the required R-2R relationship. However, it is hereinafter shown that the adverse effect can be substantially reduced by proper, compensating, circuit configuration.

One compensation step is to connect in the ladder rail, between resistor 51 and ground, an N-type transistor 57 with conducting resistance $r_{57}$ equal to the conducting resistance $r_{55}$ of the chain final stage switch 55 which drives rung resistor 50. The gate terminal of transistor 57 is permanently biased by a positive supply 58 of the same voltage as that used to turn on N-type transistors of the switches in FIG. 6. This makes the effective resistance parallel combination $R_{e48}$ include equal total, i.e. effective, rung resistances each including a like switch resistance, which like switch resistance is here for convenience also designated $r_{48}$ to associate it with the rail terminal from which that effective resistance is viewed for the least significant rung. Accordingly, the total effective resistance $R_{e48}$ seen from terminal 48 toward ground now becomes $$R_{e48}=[(R_{50}+r_{55})\times(R_{51}+r_{57})]/[(R_{50}+r_{55})\times(R_{51}+r_{57})]$$

However, since $R_{50}=R_{51}=2R$ and $r_{55}=r_{57}=r_{48}$, $R_{e48}=(R+r_{48}/2)$.

Then, backing up the ladder once again to terminal 52, it can be seen that to preserve the resistance symmetry in the parallel combination of resistors in the effective resistance $R_{e52}$ seen looking along the ladder, the resistance of the switch 54 connected to rung resistor 56 must have a value equal to the switch resistance component $r_{48}/2$ in the effective resistance at terminal 48. The switch resistance in series with the rung resistor 56 then must be $r_{48}/2$, and the new effective resistance $R_{e52}$ at terminal 52 is $$R_{e52}=R+r_{48}/4.$$

The foregoing switch resistance scaling algorithm is also recurrently applied for determining what the switch resistance should be for each switch that drives a rung relative resistance of 2R. The result is that the relative resistance values for switch resistance decrease by half at each more significant rung position, and the symmetry of the effective parallel resistance calculation is maintained at each step along the ladder network 18.

The range of switch resistance values that are practical is limited at one extreme by the resistance of the widest switch that it is practical to employ in an application. Two factors determining the practicality are semiconductor material area used and the manufacturing difficulties involves in forming sufficient individual large transistors on a chip. At the other extreme the range is limited by the resistance of the smallest switch that it is practical to manufacture. In FIG. 1, application of the switch resistance scaling algorithm is indicated by reference characters of the from "_r" adjacent to respective switches, e.g. switches 54 and 55, that are connected to ladder network resistors. An arabic numeral in the blank to the left of the "r" indicates the relative size of the resistance compared to resistances of other switches in the final stage of set 17. In that form of designation, "1r" is a unit resistance equal to the resistance of the switch having the smallest resistance, i.e. the widest gate, that is practical to be used and to allow doubling of that value at each less significant ladder rung switch until a level is reached, within the mentioned range, for the LSB rung switch. Thus, in FIG. 1, the switch 55 for the LSB rung has as the real part of its output impedance, i.e. its output resistance, the resistance 32r. The switch 54 at the next more significant rung has the output resistance 16r, and so forth up the ladder halving the rung driving switch output resistance at each step until reaching the switches for the bar coded bits.

Among the bar coded bits, all of the switches driving into ladder network resistors have the resistance 1r. The employment of a common switch size for all bar coded bits results from the previously described treatment of those switches in the ladder network. That is, the least significant bar coded bit B5A has the unit output resistance 1r as the natural culmination of scaling switch resistances in binary coded bit position, and it drives a single rung reistor of value 2R. The bar coded bits B6A and B6B drive parallel connected rung resistors of twice the usual size, i.e. 4R; and in accordance with the scaling algorithm their respective two drive switches must have a combined switch output resistance of 1r/2, i.e. one-half of the switch resistance 1r at the bit B5A switch. Thus, the rung driving switches for the B6A and B6B bar coded bits must individually have output resistances of 1r each to exhibit a combined switch resistance of 1r/2 in the parallel combination. Similarly, the bar coded bits B7A through B7D drive into parallel connected rung resistors of four times the usual rung resistor size, i.e. 8R; and their respective four drive switches have a combined switch output resistance of 1r/4, i.e. one-half of the switch resistance 1r/2 at the bit B6A and B6B switches, so that their individual switch output resistances are all the unit value 1r.

Because of the scaling of ladder rung, driving switch resistances as just described, the ladder produces essentially linear digital conversions. That is, over the full range of values that can be represented by the eight input binary coded bits N0–N7 from source 11, each incremental change in value represented by those binary coded bits causes a corresponding incremental value change, in the same direction, in the DAC analog terminal 19. It is useful to note here that if bar coding were not employed the range of switch resistance values that would be needed for proper scaling would extend from 1r to 128r for the seven-bit binary coded digital signals provided from source 11; and that larger range of switch outupt resistances means that much greater semiconductor material area would be required to implement those driving switches and their associated switches in their respective switch chains of the set 17.

The set 17 of switch chains is an illustrative embodiment of my invention as claimed in my aforementioned patent application. It will now be considered in greater depth. Although switch resistance scaling, as just described, at the rung driven point preserves ladder linearity of operation, the different rung drive switch conductances that result necessarily have different associated parasitic capacitive effects. So the switches exhibit different dynamic operating characteristics that produce non-negligible effects on the outputs of the chains as will be described.

A first of the dynamic operating characteristic differences is that of time constants of switch operation resulting from different switch conductances. The different time constants cause correspondingly, different, signal propagation delays among the chains of set 17. Plural stages of switches are provided in that set to achieve a desired impedance transformation from essentially uniform driving source output impedances, for the bit signals of a digital signal word, to substantially lower and different transformed output impedances for those signals. Furthermore, the transformation must be accomplished without unduly slowing operation of the transformation and without incurring objectionable levels of spurious signal excursions in the transformed output. The set of chains then is a matrix of switches that may have different output conductances across the chains within any given stage and along any given chain. Those different conductances have associated therewith corresponding different parasitic capacitances which have the effect of different time constants of switch operation throughout the matrix of switches. The different time constants tend to cause unequal propagation delays among the respective chains and hence noncoincident operation of output stage switches of the set. Noncoincident switch operation within a stage produces various difficulties in circuits driven by the set 17; and, in the case fo a DAC, those difficulties include distortions of the analog output from the linear output that should be faithfully produced.

In FIG. 1, an equal number of stages are employed in each switch chain to provide a coarse assurance of equal delays among the chains of switches. Embodiments using CMOS inverting switches employ an even number of stages of such switches to lend a tendency to offset some lack of conductance symmetry inherent in manufacture of complementary conductivity types of transistors used in each switch. The asymmetry gives rise to corresponding, operating, time constant asymmetry that averages out over an even number of stages of inverting switches.

Further, output conductance portions of switch output impedances in each chain are scaled along the chain to achieve a uniform stage-to-stage ratio F of output conductances so that the desired impedance transformation can be realized with a minimum number of stages for the signal propagation rate desired. The uniform ratio F equalizes switch operating time constants and, thus, equalizes propagation delays among the channels. In algebraic terms, $$F = G_{odn}/G_{odr}$$

where $G_{odn}$ and $G_{odr}$ are the output conductances of a driven stage and a driving switch, respectively, in a switch chain. Arabic numerals are shown within the triangular representation of each switch in the set 17 to indicate the overall picture of the scaling in the set. It will be immediately observed that the in-chain conductance scaling starting point is established by the aforementioned resistance scaling across the output stage of set 17 to network 18. Thus the bar coded switches in that final stage all have the unit output resistance 1r and so have the largest conductance indicated by the number 32 in the switch representation. From that point the final stage switch resistance scale up to 32r, and the corresponding final stage conductances scale downward to the unit conductance 1 in switch 55.

The exact value of the ratio F to be used is not critical, and it can be different for different applications of the chain set 17. High values of F tend to cause larger glitches, i.e. unwanted analog output signal excursions in a digital to analog converter as will be further discussed. At low operating speeds, where a glitch can dissipate within a part of a sample interval, the size of the glitch is less of a problem. For slow speed operation, e.g. about one megahertz, values of F near 10 would be satisfactory. It has been found that a value of two works well for the illustrative embodiment in which the set 17 is part of a DAC that operates at a sample rate of about 40 megahertz. As indicated by the numerals in the switch representations in set 17, all of the switches in the bar coded chains adhere to the ratio F=2 for scaling output conductances downward from 32 at the output stage, through the four intermediate stages, to 1 at the input stage of the set. If bipolar transistor switches are employed, the value of F will be higher than that for CMOS switches for any particular application.

Since all input stage switches, e.g. switch 5, in set 17 advantageously are assigned the unit conductance 1, something must be done in the chains for binary coded bit positions to permit adherence to both the uniformity of use of the ratio F=2 and the conductance (resistance) scaling across the output stage previously described. That difficulty is resolved in a chain at any stage pair, e.g. at switches 62 and 63 in the chain of bit N4, where it appears that application of the ratio F to switches in the transmission path of the chain would not otherwise conform to F. The solution requires providing a dummy load switch 66 addition to the driven stage and splitting the conductance of that stage between the in-path switch 63 and the dummy load switch 66. The dummy load switch 66 has its input connected to be driven in parallel from the switch 62, but its output drives no other in-path switch of the same chain transmission path. In some cases, to be described, the dummy-load switch is provided wih its own switch load but not in the chain transmission path between chain input and output. As can be seen in FIG. 1, the output conductance of the switch 63 conforms to the ratio F=2 with respect to its driven switch 67; and the total output conductance of the chain stage of switch 63, i.e. conductances of switches 63 and 66, conforms to the ratio F=2 with respect to its driving stage switch 62. This technique of applying dummy-load switches is applied in the same manner, as many times as may be necessary in any given chain; and it is evident that it is used five times in the chain of LSB switch 55.

In some applications additional precision in operation of the chain set output stage is required, and that is provided by adding a further switch stage, i.e. a switch 68 driven by switch 66, to each dummy load switch. The reason for this is that the speed of switch operation depends in part on the capacitance of its load. Therefore, to fix precisely the loading on switch 62, its driven switches 63 and 66 are both loaded substantially the same. Additional loading on switch 68 for still further precision can also be accomplished but it is usually not required.

Another dynamic operating characteristic, after the different time constant effect, arises from the fact that, again as a result of manufacturing process differences, the NMOS and PMOS transistors in each switch usually switch at significantly different rates; and one cannot forecast which will be the faster in any one manufacturing batch of devices. The result of the switching time difference is evident at the outputs of the final stage switches of the chain set 17 where transistors of a switch exchange, so to speak, conduction states on each switch operation. That exchange modifies significantly the currents flowing through the ladder network 18 and the analog output terminal 19. The worst case occurs at the time of a digital word value change at the midpoint of the total DAC range, illustratively between values of 127 and 128, because in an all-binary-coded representation all eight of the switches must change state, the most significant switch changing 128 units of current in one direction, i.e. ON or OFF, and the seven less significant switches together changing 127 units of current in the other direction, i.e. OFF or ON. It is noted that in a switch, e.g. 47 in FIG. 7, if 47 is assumed to be a final-stage switch, the P-type transistor 64 "sources," i.e. supplies, a current from reference supply lead 58 to lead 61 when the transistor turns ON for conduction. The N-type transistor 65 "sinks" a current to ground connection lead 59 from switch output lead 61 when the transistor turns ON for conduction. A positive signal at lead 60 turns ON the N-type transistor 65 and turns OFF the P-type transistor 64. A ground signal at lead 60 turns OFF N-type transistor 65 and turns ON P-type transistor 64.

Figure 8:
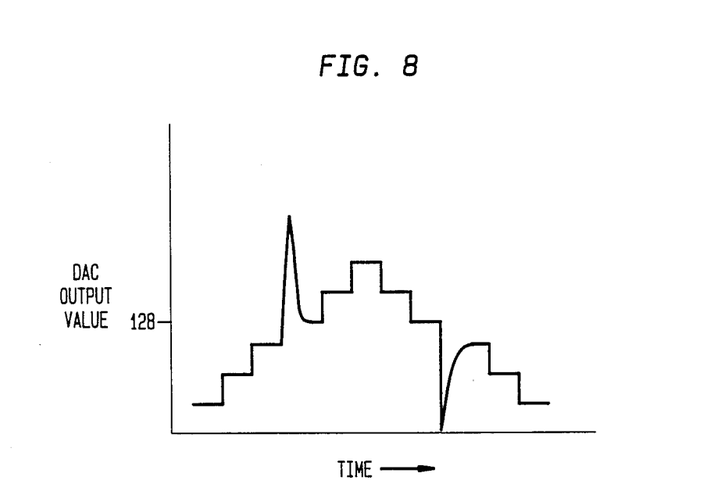
FIG. 8 shows a wave diagram illustrating a digital to analog converter analog output with superimposed amplitude excursions resulting from nonsimultaneous operation of switches coupling digital signals to the converter resistance ladder circuit.

If the two types of MOS transistors switches were initiated at the same time, the transient effects would tend to cancel and any remaining noise differential would be tolerable. However, the real-life transistor types have different switching rates; and the transistor, or transistors, that turn ON a large number of units of DAC output current in any one sample time may cause a large transient time analog signal excursion, e.g. eight or more times a single LSB-sized excursion, that requires a major portion of a signal sample time before it dissipates. Such an excursion, sometimes called a "glitch," for the illustrative transition in either direction between 127 and 128 for a fully binary coded word is illustrated in FIG. 8. The end effect of such an excursion depends upon the direction of the transition and the type of utilization circuit coupled to cable 20 output, but it at least substantially modifies the average analog signal form the true digital input sample value that should prevail. In the case of video signals being coupled to a display device, the effect can be a bloom of brightness or an unnatural increase or decrease in intensity at dividing lines between displayed objects of supposedly similar colors. Bar decoding of two or more of the most significant bits before coupling through the chain set 17 substantially reduces the number of set 17 final stage switches that must turn on for the worst case mid-range transition time and for other major binary information transition times. That reduction has been found sufficient to eliminate the mentioned video display effects of the switch operation and sufficient to reduce the change in average analog signal value to tolerable levels for most applications of the DAC.

Although the invention has been described in connection with a particular application thereof, it is to be understood that additional applications, embodiments, and modifications which will be obvious to those skilled in the art are included within the spirit and scope of the invention.

What is claimed is:

1. A digital to analog converter comprising:
   means for receiving multibit, digital, input signal words;
   an R-2R resistance ladder network having a plurality of series connected rail resistors and a plurality of rung resistors, each rung resistor having a resistance twice that of a rail resistor, said network producing at a most significant bit terminal of said series connected rail resistors analog output signals that represent the values of said input signal words;
   signal propagating means for coupling said input signal words in bit-parallel to respective rung resistors of said network, said signal propagating means having output resistance values;
   means for connecting an output coupling transmission line to said most significant bit terminal having a predetermined characteristic impedance including a real portion and an imaginary portion; and
   said selected values of said rail and rung resistors in combination with the output resistance values of said signal propagating means having a combined ladder network output impedance having a real portion that matches said transmission line characteristic impedance real portion.

2. The digital to analog converter of claim 1 wherein said signal propagating means includes:
   means for decoding a predetermined plurality of most significant bits of each of said words to an output bar coded representation thereof; and
   means for coupling both any remaining less significant bits of each of said word and said output bar coded representation to said respective rung input connections of said ladder network.

3. The digital to analog converter of claim 1 wherein at least some of the resistance portions of said signal propagating means is scaled in a binary weighted fashion of decreasing binary weighting for ones of said rung resistors of increasing binary significance.

4. The digital to analog converter of claim 3 wherein said signal propagating means includes:
   a plurality of paths having output impedances with equal resistance portions;
   said signal propagating means being divided into at least two groups having binary weighted numbers of coupling means in the respective groups whereby the combined parallel resistance portions of output impedances of the coupling means of each group conform to different extensions to said binary weighted resistance scale.

5. The digital to analog converter of claim 1 wherein said signal propagating means includes transmission paths;
   each of said transmission paths including a chain of tandem connected electrical inverters the states of which are controlled by the binary signal state of a digital signal applied thereto in such path;
   each of said chains including an equal number of said inverters in its tandem connected transmission path for transmitting signals with substantially the same propagation delay.

6. The digital to analog converter of claim 5 wherein:
   correspondingly located inverters in respective ones of said chains comprise a stage of impedance transforming circuit;
   the impedance of said transforming circuit being scaled to realize a uniform ratio F of (a) output conductance of a driven stage in the chain of each path to (b) output conductance of a prior stage inverter driving that driven stage; and at any stage of a chain where a conductance ratio between a driven stage and a driving switch for that stage would be different from F, said driving stage switch is split into at least two switch branches with inputs driven in parallel, said two branches comprising an in-path branch having an inverter in the transmission path of such chain and having a conductance ratio F with respect to said driven stage, and a dummy-load branch having an inverter with an output conductance which, with the output conductance of said in-path branch inverter, comprises a total conductance forming a conductance ratio F with respect to a stage inverter driving said in-path and dummy-path branches in parallel, said dummy-load branch driving no further inverter of said transmission path.

7. The digital to analog converter of claim 6 in which said output impedances of said in-path, final stage switches of at least some transmission paths are different from such impedances of others of said transmission paths.

8. The digital to analog converter of claim 7 in which said at least some transmission paths have resistance portions of their in-path, final stage, switch, output impedances scaled in a binary weighted fashion of decreasing binary weighting for ones of such paths of increasing binary significance.

9. The digital to analog converter of claim 8 in which:
a plurality of additional ones of said transmission paths, hereafter a plurality of paths, have output impedances with equal resistance portions; and
said plurality of paths are divided into at least two groups having binary weighted numbers of paths in the respective groups whereby the combined parallel resistance portions of final stage, in-path, switch, output impedances of the paths of each group conform to different extensions to said binary weighted scale.

10. The digital to analog converter of claim 6 wherein in each of said dummy-load branches, at least one switch in said transmission path, output conductances of said dummy-load switch and said further switch conforming to said ratio F.

11. A digital to analog converter comprising:
means for receiving multibit, digital, input signal words;
an R-2R resistance ladder network having a plurality of series connected rail resistors and a plurality of rung resistors, each rung resistor having a resistance twice that of a rail resistor, said network producing at a most significant bit terminal of said series connected rail resistors analog output signals that represent the values of said input signal words;
signal propagating means for coupling bits of each of said input signal words to respective ones of said rung input connections of said ladder network; and
said signal propagating means having output resistances scaled so that the total series resistance of each such output resistance and the rung resistor to which it is connected is substantially the same as the effective resistance presented at the rail connection point of such rung resistor from network portions of less value significance.

12. The digital to analog converter of claim 11 wherein:
said signal propagating means includes a plurality of transistor switches, each having a predetermined output impedance with a resistance portion which is said signal propagation means output resistance for the corresponding rung input to said ladder;
a most significant bit output connection and a least significant bit reference voltage supply connection on said ladder network;
a further resistor having a resistance equal to the resistance of one of said rung resistors;
a further switch including means to receive a steady state conducting bias voltage; and
means for connecting said further switch and said further resistor in series in said rail connection between said rail resistors and said least significant bit reference voltage supply connection.

13. The digital to analog converter of claim 11 further comprising:
means for decoding a predetermined plurality of most significant bits of each of said words to an output bar coded representation thereof;
means for coupling both any remaining less significant bits of each of said words and said output bar coded representation to said respective rung input connection of said ladder network;
said plurality of most significant bits include plural group of bits of increasing binary weighted size, the least significant sized group including only the least significant one of said plurality of bits; and
within each other of said groups a single rung resistance is formed from a plurality of larger substantially equal resistance resistors, each of the latter resistors being connected between an output of a different one of said separate translating means and a common connection point in said rail series connection.

14. The digital to analog converter of claim 13 in which:
said larger resistors of each of said groups have a combined, parallel circuit resistance equal to the resistance of a rung resistor; and
said separate translating means which are connected to rung resistors of said plurality of bits have equal output resistances, but within respective ones of said groups the combined parallel resistance of said separate translating means connected to any rung of such group is equal to a resistance that conforms to said scaling algorithm of said coupling means.

15. The digital to analog converter of claim 11 further comprises means for coupling bits of each of said words through separate, substantially equal-delay, impedance translating means to said respective rung resistors of said ladder network.

16. The digital to analog converter of claim 15 further comprising:
a chain of tandem connected, transistor switches; and
each of said switches comprises:
an output connection;
an input connection for receiving a digital signal in one of said transmission paths to control the operation of such switch in either direction between first and second switch states;
first and second voltage supply connections for receiving first and second voltage values; and
means, responsive to digital signals at said input connection, for coupling said output connection to said first supply connection in said first switch state and for coupling said output connection to said second supply connection in said second switch state.

17. The digital to analog converter of claim 16 further comprising in said coupling means:

first and second complementary metal-oxide-semiconductor transistors of different conductivity types, respectively, each transistor having source, gate, and drain terminals;

means for connecting gate terminals of first and second transistors to said input connection of said each switch for biasing only one or the other of said transistors into conduction in response different levels, respectively, of said input digital signals;

means for connecting source-drain paths of said transistors in series between said supply connections; and means for connecting said drain terminals of said each switch for providing at said output connection an inverted version of signals at said input connection.

18. The digital to analog converter of claim 17 further comprising in each of said chains an even number of said switch stages.

19. A digital to analog converter comprising:

means for receiving multibit, digital, input signal words;

an R-2R resistance ladder network having a plurality of series connected rail resistors and a plurality of rung resistors, said network producing at a most significant bit terminal of said rail resistors analog output signals that represent the values of said digital input signal words;

means for decoding a predetermined plurality of most significant bits of each of said words to an output bar coded representation thereof; and signal propagation means for coupling both any remaining significant bits of each of said words and said output bar coded representation to respective rung resistors of said ladder network;

said signal propagating means having output resistance values whereby the combination of the output resistance of the signal means in series with the resistance of its respective rung resistor is substantially equal to the effective resistance present at the rail connection point of that rung resistor from network sections of lesser significance.

* * * * *